United States Patent [19]

Schwalm

[11] Patent Number: 5,064,746
[45] Date of Patent: * Nov. 12, 1991

[54] RADIATION-SENSITIVE MIXTURE FOR PHOTOSENSITIVE COATING MATERIALS AND THE PRODUCTION OF RELIEF PATTERNS AND RELIEF IMAGES

[75] Inventor: Reinhold Schwalm, Wachenheim, Fed. Rep. of Germany

[73] Assignee: BASF Aktiengesellschaft, Ludwigshafen, Fed. Rep. of Germany

[ * ] Notice: The portion of the term of this patent subsequent to Nov. 28, 2006 has been disclaimed.

[21] Appl. No.: 337,923

[22] Filed: Apr. 14, 1989

[30] Foreign Application Priority Data

Apr. 14, 1989 [DE] Fed. Rep. of Germany ....... 3812325

[51] Int. Cl.$^5$ ................ G03C 1/495; G03C 5/00
[52] U.S. Cl. ................... 430/270; 430/326; 430/330; 430/910; 430/921; 430/922; 430/296; 430/942
[58] Field of Search .............. 430/290, 270, 297, 306, 430/296, 942, 921, 922, 326, 910; 460/127

[56] References Cited

U.S. PATENT DOCUMENTS

| | | |
|---|---|---|
| 3,923,514 | 12/1975 | Marsh . |
| 4,491,628 | 1/1985 | Ito et al. . |
| 4,576,902 | 3/1986 | Saenger et al. ............ 430/326 |
| 4,666,820 | 5/1987 | Chandross et al. ......... 430/326 |
| 4,678,737 | 7/1987 | Schneller et al. .......... 430/910 |
| 4,689,288 | 8/1987 | Buiguez et al. . |
| 4,770,977 | 9/1988 | Buiguez et al. ............ 430/326 |
| 4,812,542 | 3/1989 | Schwalm et al. ........... 526/265 |
| 4,883,740 | 11/1989 | Schwalm et al. ........... 430/270 |

FOREIGN PATENT DOCUMENTS

| | | |
|---|---|---|
| 132710 | 2/1985 | European Pat. Off. . |
| 3628046 | 2/1987 | European Pat. Off. . |
| 271010 | 6/1988 | European Pat. Off. ......... 430/270 |
| 297443 | 1/1989 | European Pat. Off. ......... 430/270 |

OTHER PUBLICATIONS

Novolac Resins Used in Positive Resist Systems, Pampalone, Solid State Technology, Jun. 1984, pp. 115–120.
Applications of Photoinitiated Cationic Polymerization . . . , Crivello, Polym. Sci. 48 (1985), pp. 65–60.
*Journal of Imaging Technology*, vol. 11, No. 4, Aug. 1985 pp. 146–157.

Primary Examiner—Charles L. Bowers, Jr.
Assistant Examiner—John S. Y. Chu
Attorney, Agent, or Firm—Keil & Weinkauf

[57] ABSTRACT

The radiation-sensitive mixture contains
(a) a polymeric binder which is insoluble in water but soluble in aqueous alkaline solutions and
(b) an organic compound whose solubility in an aqueous alkaline developer is increased by the action of an acid and which contains one or more acid-cleavable groups, the polymeric binder (a) being a copolymer which contains o-nitrobenzyl groups.

The novel radiation-sensitive mixture is particularly suitable for the production of photoresists.

8 Claims, No Drawings

RADIATION-SENSITIVE MIXTURE FOR PHOTOSENSITIVE COATING MATERIALS AND THE PRODUCTION OF RELIEF PATTERNS AND RELIEF IMAGES

The present invention relates to positive-working radiation-sensitive mixtures which contain a binder which is soluble in aqueous alkaline media and a compound which contains one or more acid-cleavable bonds and forms a strong acid under the action or radiation, the solubility of the compound in an alkaline solvent being increased by the action of the acid. These mixtures are sensitive to UV, electron and X-ray radiation and are particularly suitable for the production of relief patterns and relief images, in particular as resist materials.

Positive-working radiation-sensitive mixtures are known, and in particular, positive-working resist materials which contain o-quinonediazides in binders, eg. novolaks, which are soluble in aqueous alkaline media are used commerically. However, the sensitivity of some of these systems to radiation, in particular short-wavelength radiation, is unsatisfactory. This is partly due to the high absorption of the novolaks in the short-wavelength UV range. The essentially transparent polymers based on p-hydroxystyrenes are, however, described by T. Pampalone in Solid State Technology, June 1984, pages 115–120, as being not very suitable since the amount of material removed is unacceptably high in the case of these polymers.

Positive-working one-component resists containing o-nitrobenzyl groups have also been disclosed (cf. DE-A-21 50 691, DE-A-29 22 746 and DE-A-36 42 184). However, the photosensitivity of these copolymers is also unsatisfactory.

Dramatic increases in sensitivity in radiation-sensitive systems which produce, in the primary photoreaction, a species which then initiates a catalytic secondary reaction regardless of the radiation have also been described. U.S. Pat. No. 3,923,514 and U.S. Pat. No. 3,915,706 disclose, for example, photoinitiators which produce a strong acid, which then cleaves acid-labile groups, such as polyaldehyde groups, in a secondary reaction.

Radiation-sensitive mixtures of polymers having acid-labile side groups and photochemical acid donors are disclosed in, for example, U.S. Pat. No. 4,491,628 and FR-A-2 570 844. However, these polymeric binders are hydro-phobic and become alkali-soluble only after exposure.

Radiation-sensitive mixtures based on acid-cleavable compounds are also known, the said mixtures containing, as a binder, a polymer which is soluble in aqueous alkaline media, and a compound which forms a strong acid by a photochemical reaction, and a further compound having acid-cleavable bonds, which become more soluble in an alkaline developer as a result of the action of the acid (cf. for example DE-A-3 406 927).

Examples of compounds which form a strong acid by a photochemical reaction are diazonium, phosphonium, sulfonium and iodonium compounds as well as halogen compounds. The disadvantage of these photoinitiators is that the action of the radiation results in predominantly hydrophobic photochemical products which are insoluble in alkaline developers.

The use of onium salts as photochemical acid donors in resist materials is disclosed in, for example, the above-mentioned U.S. Pat. No. 4,491,628. Crivello gives an overview of their use in resist materials, in Org. Coatings and Appl. Polym. Sci. 48 (1985), 65–69.

DE-A-37 21 740 proposes sulfonium salts which contain acid-labile groups in the molecule and, as a result of the action of radiation, are altered so that the solubility in alkaline developers is dramatically increased.

It is an object of the present invention to provide highly reactive radiation-sensitive systems for the production of relief structures, the said systems being capable of being developed with aqueous alkaline solutions.

We have found that this object is achieved and that the abovementioned systems which are based on p-hydroxystyrene polymers as binders and in which a large amount of material is removed in an alkaline developer are rendered much less soluble in an alkali (in a developer of a certain strength) by the addition of a hydrophobic o-nitrobenzyl ester component, a particular advantage being the fact that the o-nitrobenzyl ester groups undergo a rearrangement reaction during exposure to give carboxylic acids, and the exposed areas thus become alkali-soluble again.

According to the invention, the alkali solubility of the exposed areas is increased both via the binder, by the photochemical production of carboxylic acid, and via the conversion of the sulfonium salts added as solubility inhibitors.

The present invention relates to a radiation sensitive mixture containing (a) a polymeric binder which is insoluble in water but soluble in aqueous alkaline solutions and (b) an organic compound whose solubility in an aqueous alkaline developer is increased by the action of an acid and which contains one or more acid-cleavable groups, wherein the polymeric binder (a) is a copolymer which contains o-nitrobenzyl groups, preferably a copolymer which contains, as copolymerized units, (a$_1$) from 1 to 40 mol % of one or more compounds of the general formula (I)

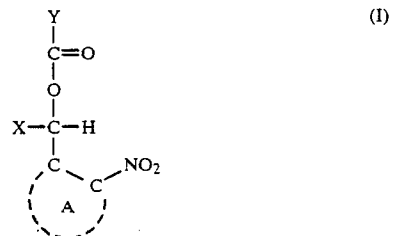

where A is an aromatic or heteroaromatic, unsubstituted or substituted ring system having 5 to 14 ring members, X is hydrogen, alkyl of 1 to 8 carbon atoms or unsubstituted or substituted aryl or aralkyl and Y is an ethylenically unsaturated radical of 2 to 10 carbon atoms, (a$_2$) from 99 to 60 mol % of one or more compounds of the general formula (II)

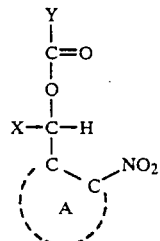

(I)

where A is an aromatic or heteroaromatic, unsubstituted or substituted ring system having 5 to 14 ring members, X is hydrogen, alkyl of 1 to 8 carbon atoms or unsubstituted or substituted aryl or aralkyl and Y is an ethylenically un-saturated radical of 2 to 10 carbon atoms, (a₂) from 99 to 60 mol % of one or more compounds of the general formula (II)

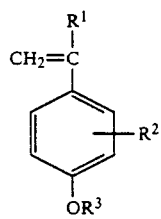

(II)

where $R^1$ is hydrogen or methyl, $R^2$ is hydrogen, halogen or alkyl of 1 to 6 carbon atoms and $R^3$ is hydrogen, alkyl of 1 to 6 carbon atoms, acetyl, benzoyl, $C_1$–$C_6$-alkylsilyl or $C_1$–$C_6$-alkoxysilyl, and (a₃) from 0 to 20 mol % of one or more further olefinically unsaturated, copolymerizable organic compounds which differ from (a₁) and (a₂) and whose homopolymers are transparent in the wavelength range from 250 to 400 nm, with the proviso that the sum of the molar percentages stated under (a₁) to (a₃) is 100.

Particularly preferred copolymers are those which contain, as copolymerized units, more than 50 mol % of a comonomer of the formula (II) where $R^3$ is H.

These alkali-soluble polymers (a) are obtained by free radical or ionic homopolymerization or copolymerization of one or more unsaturated monomers by conventional methods.

Examples of suitable o-nitrobenzyl ester monomers (a₁) of the general formula (I)

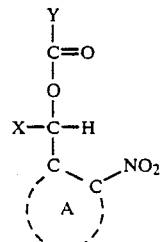

(I)

where A is an aromatic or heteroaromatic, unsubstituted or substituted ring system having 5 to 14 ring members, X is hydrogen, alkyl of 1 to 8 carbon atoms or unsubstituted or substituted aryl or aralkyl and Y is an ethylenically unsaturated radical of 2 to 10 carbon atoms, are those in which Y in the general formula (I) is one of the radicals

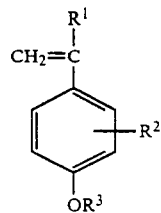

(II)

where $R^1$ is hydrogen or methyl, $R^2$ is hydrogen, halogen or alkyl of 1 to 6 carbon atoms and $R^3$ is hydrogen, alkyl of 1 to 6 carbon atoms, acetyl, benzoyl, $C_1$–$C_6$-alkylsilyl or $C_1$–$C_6$-alkoxysilyl, and (a₃) from 0 to 20 mol % of one or more further olefinically unsaturated, copolymerizable organic compounds which differ from (a₁) and (a₂) and whose homopolymers are transparent in the wavelength range from 250 to 400 nm, with the proviso that the sum of the molar percentages stated under (a₁) to (a₃) is 100.

It is preferable if the novel radiation-sensitive mixture contains, as component (b), one or more sulfonium salts of the general formula (III)

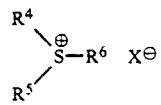

(III)

where $R^4$, $R^5$ and $R^6$ are identical or different and are aliphatic and/or aromatic radicals which may contain heteroatoms, or two of the radicals $R^4$ to $R^6$ are bonded to one another to form a ring, with the proviso that one or more of the radicals $R^4$ to $R^6$ contain one or more acid-cleavable groups, and one of the radicals $R^4$ to $R^6$ may be bonded to one or more further sulfonium salt radicals, if necessary via acid-cleavable groups, and $X^\ominus$ is a nonnucleophilic counter-ion.

The present invention furthermore relates to a process for the production of relief patterns and relief images, wherein the photosensitive coating material used is a novel radiation-sensitive mixture which is advantageously heated to 60°–120° C. after exposure.

Surprisingly, the novel radiation-sensitive mixture gives resist patterns having good structural quality when exposed in the short-wavelength UV range, preferably at 248 nm, the photosensitivity of the mixture being very high and there being no significant removal of the unexposed areas during the required development time.

Regarding the components of the novel radiation-sensitive mixture, the following may be stated specifically.

Suitable polymeric binders (a) are all polymers which contain o-nitrobenzyl groups and are insoluble in water but soluble in aqueous alkaline solutions, preferably the copolymers described in DE-A-36 42 184.

Preferred copolymers (a) are those which contain, as copolymerized units (a₁) from 1 to 40 mol % of one or more compounds of the general formula (I)

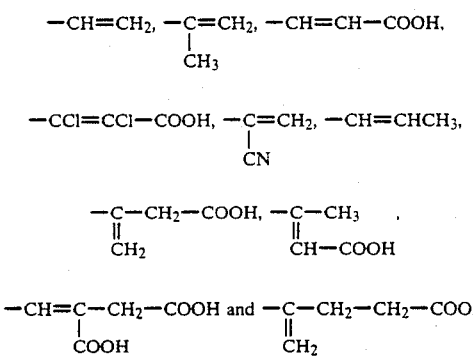

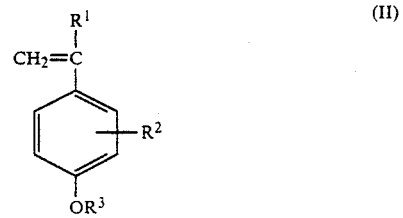

where $R^1$ is hydrogen or methyl, $R^2$ is hydrogen, halogen or alkyl of 1 to 6 carbon atoms and $R^3$ is hydrogen, alkyl of 1 to 6 carbon atoms, acetyl, benzoyl, $C_1$-$C_6$-alkylsilyl or $C_1$-$C_6$-alkoxysilyl.

Particularly preferred O-substituted p-hydroxystyrene derivatives are those in which the phenolic hydroxyl groups are etherified or esterified, for example p-methoxystyrene, p-acetoxystyrene or p-tert-butoxycarbonyloxystyrene.

Component ($a_2$) is polymerized in the novel copolymer in an amount of from 99 to 60, preferably from 95 to 85, mol %.

($a_3$) In order to improve the solubility in aqueous alkaline solvents or to obtain other properties, such as greater heat stability, the novel copolymers may contain, as copolymerized units, one or more further olefinically unsaturated, copolymerizible organic compounds which differ from ($a_1$) and ($a_3$) and whose homopolymers are transparent in the wavelength range from 250 to 400 nm.

Examples of suitable comonomers of this type are ethylenically unsaturated carboxylic acids, such as (meth)acrylic acid, maleic acid, fumaric acid, crotonic acid, itaconic acid and/or methyleneglutaric acid, other ethylenically unsaturated compounds, such as ethylene, vinylaromatics, such as styrene, dienes, such as isoprene and butadiene, vinylamines, vinylimines, acrylonitrile, methacrylonitrile, vinyl esters, vinyl ethers, vinyl halides, unsaturated anhydrides, such as maleic anhydride, unsaturated imides, such as N-substituted maleimides, esters of the abovementioned olefinically unsaturated carboxylic acids, such as esters of acrylic and in particular methacrylic acid with $C_1$-$C_8$-alcohols, preferably methyl methacrylate, and other derivatives of acrylic acid and/or methacrylic acid.

The monomers ($a_3$) can be polymerized in the novel copolymer (a) in amounts of from 0 to 20 mol %.

The sum of the molar percentages stated under ($a_1$) to ($a_3$), in the novel copolymers, is 100.

Examples of particularly preferred copolymers are those obtained from o-nitro-α-methylbenzyl methacrylate and p-hydroxystyrene, o-nitro-α-methylbenzyl meth-acrylate, p-hydroxystyrene and p-vinylanisole, o-nitro-benzyl acrylate and p-hydroxystyrene, o-nitrobenzyl meth-acrylate, p-hydroxystyrene and butyl acrylate, and o-nitrobenzyl acrylate, p-hydroxystyrene and methacrylic acid.

Preferred organic compounds (b) are those which contain one or more sulfonium salt groups and one or more tert-butyl carbonate groups or one or more silyl ether groups. However, it is also possible to use other compounds which form a strong acid when irradiated and contain an acid-cleavable bond in the same molecule.

Particularly preferred organic compounds (b) of this type are those of the general formula (III)

---

Aromatic ring systems A are, in particular, benzene and substituted benzenes. The benzene ring can be monosubstituted or polysubstituted, for example by $C_1$-$C_8$ alkyl, in particular methyl, $C_1$-$C_6$-alkoxy, in particular methoxy, halogen, such as chlorine, or nitro, amino or sulfo. Correspondingly substituted and unsubstituted polynuclear benzene derivatives, such as napthalene, anthracene, anthraquinone or phenanthrene, are also suitable. A particular example of a heteroaromatic ring system A is pyridine.

For example, the following groups have proven particularly useful as aromatic or heteroaromatic o-nitrocarbinols from which the o-nitrocarbinol ester groups are derived: o-nitrobenzyl, 6-nitroveratryl, 2-nitro-4-aminobenzyl, 2-nitro-4-dimethylaminobenzyl, 2-nitro-4-methylaminobenzyl, 2-nitro-5-dimethylaminobenzyl, 2-nitro-5-aminobenzyl, 2-nitro-4,6-dimethoxybenzyl, 2,4-dinitrobenzyl, 3-methyl-2,4-dinitrobenzyl, 2-nitro-4-methylbenzyl and 2,4,6-trinitrobenzyl alcohol, and 2-nitrobenzhydrol,2,2'-dinitrobenzhydrol,2,4-dinitrobenzhydrol and 2,2',4,4'-tetranitrobenzhydrol. Examples of other suitable substances are 2-nitro-3-hydroxymethylnaphthalene, 1-nitro-2-hydroxymethylnaphthalene and 1-nitro-2-hydroxymethylanthraquinone.

The copolymers to be used according to the invention as component (a) are, as stated above, derived from o-nitrocarbinol esters of olefinically unsaturated carboxylic acids as monomers, and, for example, acrylic acid, methacrylic acid, maleic acid, dichloromaleic acid, fumaric acid, crotonic acid, itaconic acid and methylene-glutaric acid can be used as ethylenically unsaturated mono- or dicarboxylic acids.

The o-nitrocarbinol esters of olefinically unsaturated carboxylic acids can be prepared by known methods of organic chemistry, for example the reaction of the acyl chlorides with o-nitrocarbinols or direct acid-catalyzed esterification.

Particularly preferred o-nitrocarbinol ester monomers are o-nitrobenzyl acrylate, o-nitrobenzyl methacrylate, o-nitro-α-methylbenzyl (meth)acrylate and 2-nitro-6-chloro-α-methylbenzyl (meth)acrylate.

The copolymers (a) contain the o-nitrocarbinol ester monomers ($a_1$) in general in an amount of from 1 to 40, preferably from 5 to 15, mol %, as copolymerized units.

The alkali-soluble binders (a) contain, as polymerized comonomers ($a_2$), compounds of the general formula

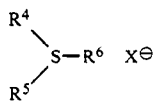 (III)

where $R^4$, $R^5$ and $R^6$ are identical or different and are each an aliphatic radical, for example alkyl of 1 to 12, preferably 1 to 6, carbon atoms, such as methyl, ethyl, n-propyl, isopropyl, n-butyl, isobutyl, tert-butyl, pentyl or hexyl, a cycloaliphatic radical, such as cyclohexyl or cyclopentyl, each of which may be unsubstituted or substituted, or an aryl radical, such as phenyl or naphthyl, or aryl which is substituted by 1 to 4 alkyl groups of 1 to 6, preferably 1 to 4, carbon atoms, alkoxy groups of 1 to 4, preferably 1 to 3, carbon atoms or 1 or 2 halogen atoms, such as fluorine, chlorine or bromine, examples of such aryl radicals being methylphenyl, methoxyphenyl, chlorophenyl, bromophenyl, dichlorophenyl and dimethylphenyl, or two of the radicals $R^4$ to $R^6$ may be bonded to one another to form a ring, in particular a 5-membered or 6-membered ring, one or more of the radicals $R^4$ to $R^6$ containing one or more acid-cleavable groups.

Examples are sulfonium salts of the general formula (III) in which $R^6$ is, for example, 4-tert-butoxycarbonyloxyphenyl, 4-tert-butoxycarbonyloxy-3,5-dimethylphenyl, 4-tert-butoxycarbonyloxy-3-methylphenyl, 4-tertbutoxycarbonyloxy-2-methylphenyl, 4-tert-butoxycarbonyloxy-3,5-dimethoxyphenyl, 4-tert-butoxycarbonyloxy-3,5diphenylphenyl, 4-tert-butoxycarbonyloxy-1-naphthyl, 4-trimethylsilyloxyphenyl or 4-trimethylsilyloxy-1-naphthyl, and those in which $R^4$ and $R^5$ form, for example, a tetramethylene bridge and $R^6$ has the same meanings as above

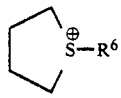

or compounds in which $R^4$ is methyl and $R^5$ is phenyl or tolyl and $R^6$ is a substituted phenyl derivative having acid-cleavable groups, for example

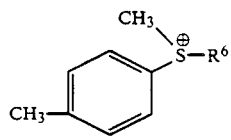

where $R^6$ is, for example, 4-tert-butoxycarbonyloxyphenyl, 2,4-di-tert-butoxycarbonyloxyphenyl, 4-tert-butoxycarbonyloxy-2-methoxyphenyl or 4-trimethylsilylphenyl, or where $R^4$ is phenyl or $C_1$–$C_{12}$-substituted phenyl or halogen-substituted phenyl and $R^5$ and $R^6$ are substituted phenyl derivatives having acid-cleavable groups, for example

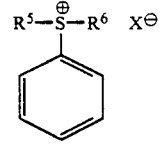

where $R^5$ and $R^6$ are each, for example, 4-tert-butoxycarbonyloxyphenyl, 4-trimethylsilyloxyphenyl, 4-tertbutyldimethylsilyloxyphenyl or 4-tert-butoxycarbonyloxy-3,5-dimethylphenyl, or $R^4$, $R^5$ and $R^6$ are identical, ie. are sulfonium salts in which three of these radicals having acid-cleavable groups are present.

Other suitable compounds are those of the general formula (III) where one of the radicals $R^4$ to $R^6$ is bonded to one or more further sulfonium salt radicals, if necessary via acid-cleavable groups, ie. compounds which likewise have a plurality of sulfonium groups in the molecule, for example

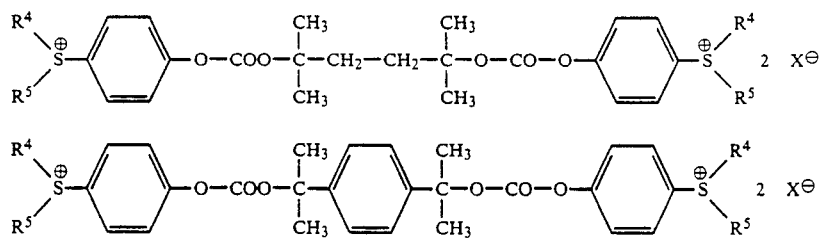

Other examples of sulfonium salts to be used according to the invention are shown below:

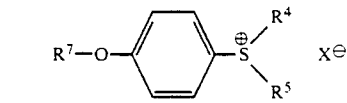

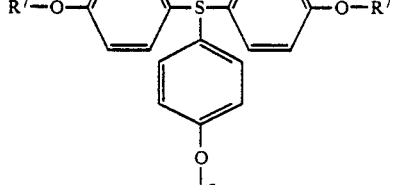

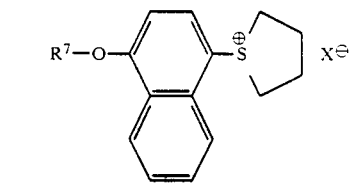

where $X^\ominus$ is halogen but preferably a complex anion, such as $BF_4^\ominus$, $AsF_6^\ominus$, $SbF_6^\ominus$ or $PF_6^\ominus$, $R^4$ and $R^5$, as stated above, are each alkyl or unsubstituted or substituted aryl or are bonded to one another to form a ring (ie. bivalent, eg. tetramethylene), and $R^7$ is tert-butoxycarbonyl or trialkylsilyl, eg. trimethylsilyl or tert-butyldimethylsilyl.

The sulfonium salts can be prepared by conventional methods of organic chemistry for the synthesis of esters, carbonates and ethers, by starting from known sulfonium salts having phenolic groups and reacting these so that tert-butyl esters, tert-butyl carbonates or silyl ethers of phenols are formed.

Examples of preferred sulfonium salts are the dimethyl-4-tert-butoxycarbonyloxyphenylsulfonium salt with hexafluoroarsenate, hexafluoroantimonate, hexafluorophosphate and/or hexafluoborate as counter-ion, the phenyl bis-(4-tert-butoxycarbonyloxyphenyl)-sulfonium salt with the stated counter-ions, the tris-(4-tert-butoxy-carbonyloxyphenyl)-sulfonium salt with the stated counter-ions and the 1-naphthyl-4-trimethyl-silyloxytetramethylenesulfonium salt with the stated counter-ions.

The novel radiation-sensitive mixtures are sensitive to X-ray, electron and UV radiation. If necessary, small amounts of sensitizers, such as pyrene and perylene, may be added in order to sensitize the compounds in the longer wavelength UV to visible wavelength range.

Process for the production of relief patterns

In the novel process for the production of relief patterns, a radiation-sensitive recording layer, which essentially consists of the novel radiation-sensitive mixture, is exposed imagewise to a dose such that the solubility of the exposed areas after a heating step at from 60° to 120° C. in aqueous alkaline solvents increases and these areas can be removed selectively using an alkaline developer.

Preferably, for example, the polymeric binder (a), which contains from 1 to 40 mol % of monomer component ($a_1$) and from 99 to 60 mol % of monomer component ($a_2$) as copolymerized units, and from 2 to 20, particularly preferably from 5 to 15% by weight of a compound of type (b) are dissolved in methylglycol acetate or methylpropylene glycol acetate, the percentages by weight being based on the total weight of the compounds (a) and (b) and the solids content being from 10 to 30% by weight. The solution can be passed through a filter having a pore diameter of 0.2 μm. By applying the resist solution by spin-coating at speeds of from 1,000 to 10,000 rpm to a wafer, a resist film is produced on the wafer. The wafer is then heated for from 1 to 5 minutes at 90° C. or 80° C. The films are then exposed to UV light from a mercury lamp, to laser light or to electron or X-ray radiation through a chromium-plated structured quartz mask. The irradiated films are heated for from 5 seconds to 2 minutes at from 60° to 120° C. The films treated in this manner are then developed with an alkaline or alcoholic developer, the exposed areas being selectively removed while little or no removal of material occurs in the unexposed areas.

The novel radiation-sensitive mixture is distinguished from the prior art mixtures in that the novel two-component system based on an alkali-soluble binder and a solubility-inhibiting sulfonium compound gives resist patterns of good structural quality if the resist patterns are produced by the conventional method and are preferably additionally heated to 60°–120° C. after exposure.

The positive-working photoresists which can thus be obtained have substantial advantages with respect to the photosensitivity in the short wavelength UV range (preferably at 248 nm) and the quality of the resist structures which can be produced.

In the Examples and Comparative Examples, parts and percentages are by weight, unless stated otherwise.

EXAMPLE 1

A photoresist solution is prepared from 10 parts of tris-(4-tert-butoxycarbonyloxyphenyl)-sulfonium hexafluoroarsenate and 90 parts of a copolymer of 90 mol % of p-hydroxystyrene and 10 mol % of o-nitro-α-methylbenzyl methacrylate in 400 parts of methylpropylene glycol acetate. The solution is passed through a filter having a pore diameter of 0.2 μm. The resist solution is applied by spin-coating to a silicon wafer having an $SiO_2$ film, in a layer thickness of about 1.0 μm. The optical density of this layer at 248 nm is 0.55. The wafer is dried for one minute at 90° C., then brought into contact with an imagewise structured test mask and exposed for 5 seconds to excimer laser light having a wavelength of 248 nm. Thereafter, heating is carried out for 60 seconds at 80° C. and development with a developer of pH 13.00 is effected for 60 seconds. The exposed areas are completely removed while there is no measurable removal of material from the unexposed areas. The resist patterns have vertical side walls.

COMPARATIVE EXAMPLE 1

Resist formulation without sulfonium salt

A photoresist solution is prepared from a copolymer of 78 mol % of p-hydroxystyrene and 22 mol % of o-nitro-α-methylbenzyl methacrylate in methylpropylene glycol acetate, and the solution is filtered and is applied by spin-coating, in a layer thickness of 1 μm, to a silicon wafer having an $SiO_2$ film. The optical density of this layer is 0.54. After heating has been carried out for one minute at 90° C., the layer is brought into contact with an imagewise structured test mask and exposed to excimer laser light having a wavelength of 248 nm. In order competely to remove the exposed areas using a developer of pH 13.00 in the course of 60 seconds, the film has to be exposed for 30 seconds.

COMPARATIVE EXAMPLE 2

Binder without o-nitrobenzyl groups

A photoresist solution is prepared from 10 parts of tris-(4-tert-butoxycarbonyloxyphenyl)-sulfonium hexafluoroarsenate, 90 parts of poly-(p-hydroxystyrene) and 400 parts of methylpropylene glycol acetate. The solution is then passed through a filter having a pore diameter of 0.2 μm. The resist solution is applied by spincoating to a silicon wafer having an $SiO_2$ film, in a layer thickness of 1.0 μm. The wafer is dried for one minute at 90° C. and then brought into contact with an imagewise structured test mask and exposed for 3 seconds to excimer laser light having a wavelength of 248 nm. Thereafter, heating is carried out for 60 seconds at 80° C. When development is carried out for 60 seconds using a developer of pH 13.00, as in Example 1, the exposed areas are completely removed but removal of material from the unexposed areas is too high (58%).

I claim:

1. A radiation-sensitive mixture containing
    (a) a polymeric binder which is insoluble in water but soluble in aqueous alkaline solutions and
    (b) an organic compound containing one or more sulfonium salt groups whose solubility in an aqueous alkaline developer is increased by the action of an acid and which contains one or more acid-cleavage groups,
wherein the polymeric binder (a) is a copolymer which contains o-nitrobenzyl groups.

2. A radiation-sensitive mixture as defined in claim 1, wherein the polymeric binder (a) which is insoluble in water but soluble in aqueous alkaline solutions is a copolymer which contains, as copolymerized units, (a$_1$) from 1 to 40 mol % of one or more compounds of the formula (I)

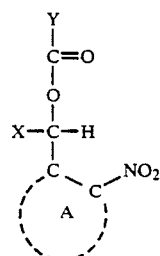

where A is an aromatic or heteroaromatic, unsubstituted or substituted ring system having 5 to 14 ring members, X is hydrogen, alkyl of 1 to 8 carbon atoms or unsubstituted or substituted aryl or aralkyl and Y is an ethylenically un-saturated radical of 2 to 10 carbon atoms, (a$_2$) from 99 to 60 mol % of one or more compounds of the formula (II)

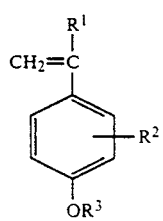

where R$^1$ is hydrogen or methyl, R$^2$ is hydrogen, halogen or alkyl of 1 to 6 carbon atoms and R$^3$ is hydrogen, alkyl of 1 to 6 carbon atoms, acetyl, benzoyl, C$_1$–C$_6$-alkylsilyl or C$_1$–C$_6$-alkoxysilyl, and (a$_3$) from 0 to 20 mol % of one or more further olefinically unsaturated, copolymerizable organic compounds which differ from (a$_1$) and (a$_2$) and whose homopolymers are transparent in the wavelength range from 250 to 400 nm, with the proviso that the sum of the molar percentages stated under (a$_1$) to (a$_3$) is 100.

3. A radiation-sensitive mixture as defined in claim 1, which contains, as component (b), one or more sulfonium salts of the formula (III)

where R$^4$, R$^5$ and R$^6$ are identical or different and are aliphatic and/or aromatic radicals which may contain heteroatoms, or two of the radicals R$^4$ to R$^6$ are bonded to one another to form a ring, with the proviso that one or more of the radicals R$^4$ to R$^6$ contain one or more acid-cleavable groups, and one of the radicals R$^4$ to R$^6$ may be bonded to one or more further sulfonium salt radicals, if necessary via acid-cleavable groups, and X$^\ominus$ is a nonnucleophilic counter-ion.

4. A radiation-sensitive mixture as defined in claim 2, which contains, as component (b), one or more sulfonium salts of the formula (III)

where R$^4$, R$^5$ and R$^6$ are identical or different and are aliphatic and/or aromatic radicals which may contain heteroatoms, or two of the radicals R$^4$ to R$^6$ are bonded to one another to form a ring, with the proviso that one or more of the radicals R$^4$ to R$^6$ contain one or more acid-cleavable groups, and one or the radicals R$^4$ to R$^6$ may be bonded to one or more further sulfonium salt radicals, if necessary via acid-cleavable groups, and X$^\ominus$ is a nonnucleophilic counter-ion.

5. A process for producing relief patterns and relief images, which comprises spincoating a solution of a radiation-sensitive mixture as defined in claim 1 onto a wafer to form a resist film, heating the coated wafer, exposing the coated wafer imagewise to excimer laser light, X-ray radiation, electron radiation or UV radiation, heating the exposed film and developing the film with an aqueous alkaline solvent.

6. A process for the production of relief patterns as defined in claim 5, wherein, after exposure, heating is carried out at from 60° to 120° C.

7. A process for producing relief patterns and relief images, which comprises spincoating a solution of a radiation sensitive mixture as defined in claim 2 onto a wafer to form a resist film, heating the coated wafer, exposing the coated wafer imagewise to excimer laser light, X-ray radiation, electron radiation or UV radiation, heating the exposed film and developing the film with an aqueous alkaline solvent.

8. A process for producing relief patterns and relief images, which comprises spincoating a solution of a radiation sensitive mixture as defined in claim 3 onto a wafer to form a resist film, heating the coated wafer, exposing the coated wafer imagewise to excimer laser light, X-ray radiation, electron radiation or UV radiation, heating the exposed film and developing the film with an aqueous alkaline solvent.

* * * * *

UNITED STATES PATENT AND TRADEMARK OFFICE
CERTIFICATE OF CORRECTION

PATENT NO. : 5,064,746

DATED : November 12, 1991

INVENTOR(S) : Reinhold SCHWALM

It is certified that error appears in the above-identified patent and that said Letters Patent is hereby corrected as shown below:

On the Cover Page, Foreign Application Priority Data

"April 14, 1989" should read --April 14, 1988--

Signed and Sealed this

Sixth Day of April, 1993

Attest:

STEPHEN G. KUNIN

*Attesting Officer*     Acting Commissioner of Patents and Trademarks